(12) United States Patent
McGrath et al.

(10) Patent No.: US 12,534,473 B2
(45) Date of Patent: Jan. 27, 2026

(54) METHODS FOR INCREASING EFFICIENCY AND STABILITY OF ORGANIC PEROVSKITE MATERIALS

(71) Applicant: Arizona Board of Regents on Behalf of the University of Arizona, a body corporate, Tucson, AZ (US)

(72) Inventors: Dominic V. McGrath, Tucson, AZ (US); Neal R. Armstrong, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 1005 days.

(21) Appl. No.: 17/629,396

(22) PCT Filed: Jul. 23, 2020

(86) PCT No.: PCT/US2020/043225
§ 371 (c)(1),
(2) Date: Jan. 23, 2022

(87) PCT Pub. No.: WO2021/016432
PCT Pub. Date: Jan. 28, 2021

(65) Prior Publication Data
US 2022/0271235 A1    Aug. 25, 2022

(30) Foreign Application Priority Data
Jul. 24, 2019 (CN) .......................... 201910671163.5

(51) Int. Cl.
*C07D 487/22* (2006.01)
*B82Y 30/00* (2011.01)
(Continued)

(52) U.S. Cl.
CPC ......... *C07D 487/22* (2013.01); *H10K 85/311* (2023.02); *H10K 85/381* (2023.02);
(Continued)

(58) Field of Classification Search
CPC ...... C07D 487/22; H10K 85/50; H10K 85/00; H10K 85/311
See application file for complete search history.

(56) References Cited

U.S. PATENT DOCUMENTS

2018/0366277 A1    12/2018  Seo et al.
2018/0366658 A1 *  12/2018  Barr ..................... H10K 85/311

FOREIGN PATENT DOCUMENTS

CN    106953014 A   *  7/2017  ......... H01L 51/0032
JP    2011241334 A  *  12/2011

OTHER PUBLICATIONS

English Translation of CN-106953014-A (Year: 2017).*
(Continued)

*Primary Examiner* — Kourtney R S Carlson
(74) *Attorney, Agent, or Firm* — HUNTON ANDREWS KURTH LLP

(57) ABSTRACT

The present invention provides methods for increasing stability and efficiency of organic perovskite materials for use in various electronic devices. In particular, methods of the invention use a non-peripheral substituted phthalocyanine for passivating defects in organic perovskite materials, thereby increasing its stability and efficiency relative to the same material in the absence of said non-peripheral substituted phthalocyanine.

12 Claims, 8 Drawing Sheets

(51) Int. Cl.
  *H10K 30/50* (2023.01)
  *H10K 85/30* (2023.01)
  *H10K 85/50* (2023.01)
  *H10K 85/60* (2023.01)

(52) U.S. Cl.
  CPC ......... *H10K 85/50* (2023.02); *H10K 85/6572* (2023.02); *B82Y 30/00* (2013.01); *H10K 30/50* (2023.02)

(56) References Cited

OTHER PUBLICATIONS

Hu, Qikun, et al. âP3HT/phthalocyanine nanocomposites as efficient holeâtransporting materials for perovskite solar cells.â Solar RRL, vol. 3, No. 1, Nov. 12, 2018, https://doi.org/10.1002/solr.201800264. (Year: 2018).*

International Search Report and Written Opinion for International Patent Application No. PCT/US2020/043225 mailed on Oct. 26, 2020.

Urbani et al. 'Phthalocyanines and porphyrinoid analogues as hole- and electron-transporting materials for perovskite solar cells', Chemical Society Reviews, Apr. 29, 2019, vol. 48, pp. 2738-2766; p. 2739, p. 2740, p. 2741, p. 2747, p. 2749, p. 2751.

Sfyri et al. 'Tetra methyl substituted Cu(II) phthalocyanine as alternative hole transporting material for organometal halide perovskite solar cells', Applied Surface Science, Nov. 14, 2015 (Nov. 14, 2015), vol. 360, pp. 767-771; Title, p. 768, p. 769.

Sakamoto et al. 'Synthesis of near-infrared absorbed metal phthalocyanine with S-aryl groups at non-peripheral positions', Journal of Porphyrins and Phthalocyanines, 2010, vol. 14, pp. 47-54; Abstract, p. 51.

Wangyang et al. 'Recent Advances in Halide Perovskite Photodetectors Based on Different Dimensional Materials', Advanced Optical Materials, Mar. 30, 2018 (Mar. 20, 2018), vol. 6, pp. 1-30; Abstract.

* cited by examiner

METHODS FOR INCREASING EFFICIENCY AND STABILITY OF ORGANIC PEROVSKITE MATERIALS

STATEMENT REGARDING FEDERALLY FUNDED RESEARCH

This invention was made with government support under Grant No. DE-SC0001084, awarded by DOE and Grant Nos. 0719437 and 1464530, awarded by NSF. The government has certain rights in the invention.

CROSS-REFERENCE TO RELATED APPLICATIONS

This application claims the priority benefit of Chinese Patent Application No. 201910671163.5, filed Jul. 25, 2019, which is incorporated herein by reference in its entirety.

FIELD OF THE INVENTION

The present invention relates to a method for increasing stability and efficiency of organic perovskite materials for use in various electronic devices. In particular, the present invention relates to using a non-peripheral substituted phthalocyanine for passivating defects in in organic perovskite materials.

BACKGROUND OF THE INVENTION

Organic-inorganic hybrid perovskite materials (or simply "organic perovskite materials") have attracted a significant attention from research activities in the field of optoelectronics and the photovoltaic industry, due to their merits of tuneable and appropriate direct band gap, high absorption coefficient, superior ambipolar charge mobility and long charge diffusion length, and small exciton binding energy. Perovskite solar cells (PSCs) have shown a tremendous improvement in power conversion efficiency (PCE) during the last decade, reaching to the current world record of 25.2% from the initial 3.8% in 2009. Although, the efficiency of PSCs is approaching the single-junction Shockley-Queisser (SQ) limit, realizing the highest possible efficiencies for PSCs requires developing strategies to reduce the large number of crystallographic defects within bulk polycrystalline perovskite films and the grain boundaries (GBs). Such defects can result in higher number of trap states, which cause enhanced charge recombination losses, as well as forming channels to diffuse moisture and simplify ion migration, leading to a lower stability for perovskite layer.

Methylammonium lead iodide ($MAPbI_3$) is the most well-known organic perovskite material, employed as light absorber in PSCs. However, it has been shown that the chemical composition of $MAPbI_3$ can be nonstoichiometric at GBs or crystal surfaces. Methylammonium cation ($MA^+$) tends to be released from the perovskite crystal upon heat, moisture and light exposure, due to its intrinsic instability. Without being bound by any theory, it is believed that this can result in under-coordinated Pb vacancies, or excessive $PbI_2$ phase, both of which are Lewis acid defects. As an effective strategy to passivate such defects and improve the overall performance of PSCs, inert molecules or polymers with Lewis base property have been introduced to perovskite layer as chemical additives or interlayers. Lewis base molecules tend to form adduct with $Pb^{2+}$ ion and slow down the crystal growth inside the perovskite thin film during the spin coating process, which can enhance the final thin film quality and coverage. This will ultimately reduce the pinholes in the film and modify the GBs.

Poly (methyl methacrylate) (PMMA) has carbonyl ($C=O$) groups, which can act as Lewis base and interact with under-coordinated $Pb^+$ ions. PMMA has been used as a passivating thin overlayer on the top of $MAPbI_3$, significantly enhancing the efficiency of the PSCs, due to increased $V_{OC}$ by filling the surface and GB defects. PMMA passivation on both the perovskite/hole-transport material ("HTM") and perovskite/electron-transport material ("ETM") interfaces led to an improvement in $V_{OC}$ from 1.09 to 1.22 V. Replacing small organic cations with bulky ones (e.g., n-butylammonium and 2-phenylethylammonium) can cause the conversion of the perovskite structure from 3D to 2D due to the steric effects. 2D perovskites offer higher environmental stability compared to their traditional 3D counterparts. Inserting a 2D perovskite film as interlayer between perovskite and charge transport layers is also considered as a method to passivate the interfacial defects. However, the insulating character and the poor charge transport properties of the organic spacers and polymers usually acts as a resistive interlayer on device level, limiting the further enhancement of performance of PSCs.

Therefore, there is a continuing need for a low-cost semiconducting material with high conductivity and charge transport ability as well as high stability that can passivate perovskite crystal defects.

SUMMARY OF THE INVENTION

Defects in grain boundaries and surface of the organometal halide perovskite thin films have detrimental effects and critical influences on the efficiency and stability of perovskite solar cells (PSCs). To address this issue, semiconducting molecules have been employed to passivate traps existed in the perovskite film. Accordingly, some aspects of the invention provide a method for increasing stability or efficiency of an electronic component comprising a hybrid organometal halide perovskite. The terms "hybrid organometal halide perovskite" and "organometal halide perovskite" and "perovskite" are used interchangeably herein and refers to a organometal halide perovskites, which is well known to one skilled in the art.

Methods of the invention generally include contacting the organometal halide perovskite with a non-peripheral substituted phthalocyanine. The term "non-peripheral" when referring to phthalocyanine refers to positions 1, 4, 8, 11, 15, 18, 22, and 25. Non-peripheral substituted phthalocyanines of the invention include at least four, typically at least six, and often eight non-peripheral substituents. In some embodiments, the non-peripheral substituted phthalocyanine is coated onto a surface of the hybrid organometal halide perovskite. Still in other embodiments, the non-peripheral substituted phthalocyanine is added (e.g., as an additive) to the hybrid organometal halide perovskite during a fabrication process of the electronic component. Yet in other embodiments, the non-peripheral substituted phthalocyanine can be used as both an additive and a coating of the hybrid organometal halide perovskite. Without being bound by any theory, it is believed that efficiency and/or stability of hybrid organometal halide perovskite is increased due to passivation of crystallographic defects within bulk polycrystalline structure and/or the grain boundaries (GBs) of the hybrid organometal halide perovskite. Thus, some aspects of the invention provide a molecular design strategy to passivate the defects on surface and/or depth of the perovskite layer.

In some embodiments, phthalocyanine (Pc) molecules, in particular non-peripheral substituted Pcs are used to enhance efficiency and/or stability of the organometal halide perovskite materials. Yet in other embodiments, said non-peripheral substituted phthalocyanine is a hydrophobic phthalocyanine.

Still in other embodiments, the presence of said non-peripheral substituted phthalocyanine increases a water droplet angle measurement by at least about 14% relative to the same hybrid organometal halide perovskite material in the absence of said non-peripheral substituted phthalocyanine.

Yet in other embodiments, the presence of said non-peripheral substituted phthalocyanine increases a thermal stability by at least about 50% relative to the same organometal halide perovskite material in the absence of said non-peripheral substituted phthalocyanine.

Still yet in other embodiment, the presence of said non-peripheral substituted phthalocyanine reduces a root mean square roughness of said organometal halide perovskite material by at least 40% relative to the same organometal halide perovskite material in the absence of said non-peripheral substituted phthalocyanine.

In other embodiments, a root mean square roughness of said organometal halide perovskite material comprising said non-peripheral substituted phthalocyanine is less than 10 nm.

In one particular embodiment, the non-peripheral substituted phthalocyanine is of the formula:

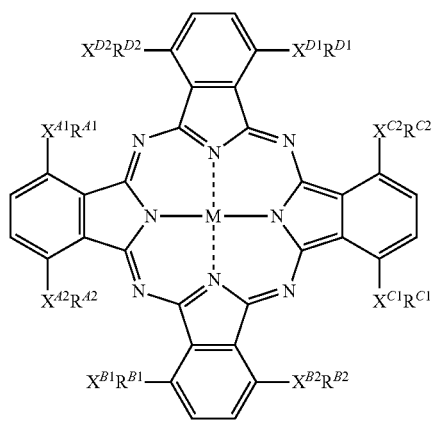

I where M is Ti=O, Zn, Cu, Fe, V=O, Al—Cl, Ga—Cl, In—Cl, Al—Br, Ga—Br, or In—Br; each of $X^{A1}$, $X^{A2}$, $X^{B1}$, $X^{B2}$, $X^{C1}$, $X^{C2}$, $X^{D1}$, and $X^{D2}$ is independently S, O, or $NR^1$; each of $R^{A1}$, $R^{A2}$, $R^{B1}$, $R^{B2}$, $R^{C1}$, $R^{C2}$, $R^{D1}$, and $R^{D2}$ is independently H or $C_4$-$C_{20}$ alkyl; and each $R^1$ is independently H, $C_1$-$C_{20}$ alkyl, or a nitrogen protection group, provided at least four of $R^{A1}$, $R^{A2}$, $R^{B1}$, $R^{B2}$, $R^{C1}$, $X^{C2}$, $R^{D1}$, and $R^{D2}$ is independently $C_4$-$C_{20}$ alkyl. In some embodiments, at least six of $R^{A1}$, $R^{A2}$, $R^{B1}$, $R^{B2}$, $R^{C1}$, $R^{C2}$, $R^{D1}$, and $R^{D2}$ is independently $C_4$-$C_{20}$ alkyl. Still in other embodiments, each of $R^{A1}$, $R^{A2}$, $R^{B1}$, $R^{B2}$, $R^{C1}$, $R^{C2}$, $R^{D1}$, and $R^{D2}$ is independently $C_4$-$C_{20}$ alkyl, typically independently $C_4$-$C_{15}$ alkyl, often $C_4$-$C_{12}$ alkyl, and most often $C_4$-$C_8$ alkyl. In one particular embodiment, $R^{A1}$, $R^{A2}$, $R^{B1}$, $R^{B2}$, $R^{C1}$, $R^{C2}$, $R^{D1}$, and $R^{D2}$ are hexyl. Yet in other embodiments, each of $X^{A1}$, $X^{A2}$, $X^{B1}$, $X^{B2}$, $X^{C1}$, $X^{C2}$, $X^{D1}$, and $X^{D2}$ is independently S or O. In one particular embodiment, $X^{A1}$, $X^{A2}$, $X^{B1}$, $X^{B2}$, $X^{C1}$, $X^{C2}$, $X^{D1}$, and $X^{D2}$ are S.

In further embodiments, said electronic component comprises a photovoltaic device, a light-emitting diode, a photovoltaic sensor, or photodetectors (e.g., for both the UV-Vis and X-ray regions of the electromagnetic spectrum). In one particular embodiment, said photovoltaic device comprises a solar cell or a photodetector.

In one particular embodiment, said hybrid organometal halide perovskite material is of the formula: $ABX_mY_{3-m}$, where A comprises $CH_3NH_3$, $C_4H_9NH_3$, $NH_2$=$CHNH_2$, $NH_2$=$C(NH_2)_2$, or a combination thereof; B is Pb, Sn, or Bi; each of X and Y is independently a halide selected from the group consisting of Cl, Br and I; and m is an integer from 1 to 3.

Yet in another embodiment, said organometal halide perovskite is of the formula: $Cs_a(MA_bFA_{1-b})_{1-a}Pb(I_kCl_jBr_{1-k-j})_3$, where MA is $CH_3NH_3$; FA is $NH_2$=$CHNH_2$; a=0.01 to 0.06; b=0.1 to 0.2; j=0.8 to 0.9, and k=0.8 to 0.9. It should be appreciated that the values a, b, k, and j are such that the overall net charge of the organometal halide perovskite is neutral.

Another aspect of the invention provides an electronic device comprising a photovoltaic component, wherein said photovoltaic component comprises an organic halide perovskite material that is coated with a thin film of and/or comprising an additive of a non-peripheral substituted phthalocyanine compound, wherein said non-peripheral substituted phthalocyanine is of the formula I.

In some embodiments, said electronic device comprises a photovoltaic device. Yet in other embodiments, said photovoltaic device comprises a solar cell, a light-emitting diode, a photovoltaic sensor, or a photodetector. Still in other embodiments, said photodetector is adapted for detecting both UV-Vis and X-ray regions of the electromagnetic spectrum.

The presence of said non-peripheral substituted phthalocyanine increases stability of said photovoltaic component relative to the same photovoltaic component in the absence of said non-peripheral substituted phthalocyanine. In this manner, the half-life of the photovoltaic component is significantly increased relative to the same photovoltaic component in the absence of a non-peripheral substituted phthalocyanine. In some embodiments, the presence of said non-peripheral substituted phthalocyanine increases thermal stability of said photovoltaic component by at least about 50% relative to the same photovoltaic component in the absence of said non-peripheral substituted phthalocyanine. Yet in other embodiments, the presence of said non-peripheral substituted phthalocyanine increases hydrophobicity of said photovoltaic component relative to the same photovoltaic component in the absence of said non-peripheral substituted phthalocyanine.

DETAILED DESCRIPTION OF THE INVENTION

Figure 1:
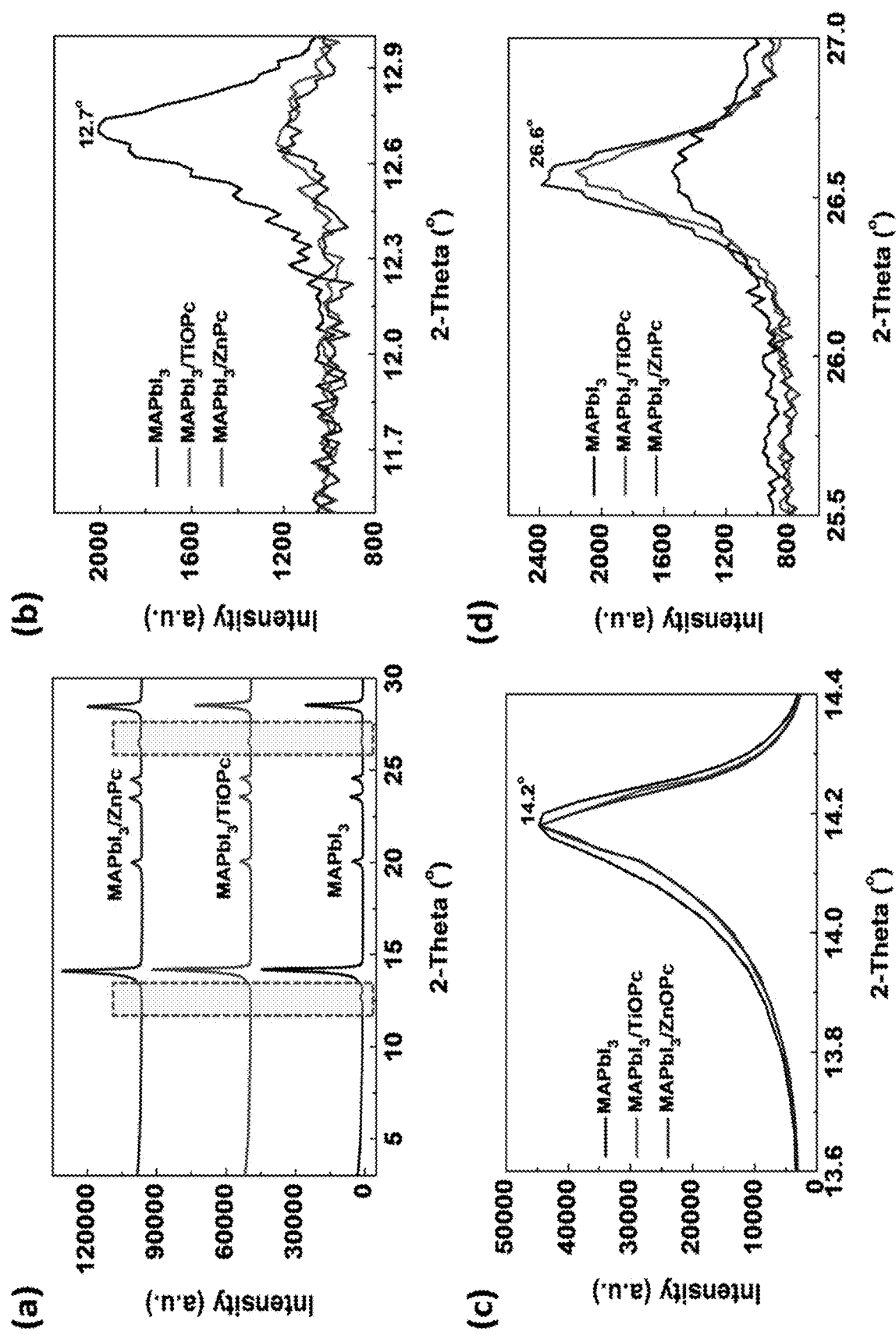
FIG. 1 shows XRD patterns. Panel (a) is XRD patterns of control $MAPbI_3$ and passivated $MAPbI_3$/ZnPc and $MAPbI_3$/TiOPc films. Panel (b) is enlarged XRD pattern of $MAPbI_3$, $MAPbI_3$/ZnPc and $MAPbI_3$/TiOPc films around the peak at 12.7°. Panel (c) is enlarged XRD pattern of $MAPbI_3$, $MAPbI_3$/ZnPc and $MAPbI_3$/TiOPc films around the peak at 14.2°. Panel (d) is enlarged XRD pattern of $MAPbI_3$, $MAPbI_3$/ZnPc and $MAPbI_3$/TiOPc films around the peak at 26.6°.

Phthalocyanine (Pc) derivatives are organic p-type small molecule semiconductors with an extended π-conjugated system, planar structure, broad light absorption, excellent charge transport ability, and thermal and chemical stability. Pcs have been used as sensitizers in dye-sensitized solar cells (DSSCs), p-type donors in organic photovoltaic cells (OPVCs), and most recently as hole transporting materials (HTMs) in PSCs. Pc materials have also been studied as additives for perovskite thin films or as interfacial modifying agents in PSCs. Pc compounds have also been utilized as surface modifying agent for perovskite film and introduced into the anti-solvent during one-step deposition of perovskite layer. In this method, the mixed anti-solvent helps improving the interfacial contact of perovskite with the HTM layer, prior to completion of the perovskite crystals. Pc decoration could decrease the hole trap state density, increase the perovskite hole mobility and the charge carrier transfer and extraction.

Accordingly, some aspects of the present invention provide methods for using a non-peripheral substituted phthalocyanine compounds to increase stability and/or efficiency of an organometal halide perovskite materials. In particular, methods of the invention including passivating defects present in an organometal halide perovskite material by coating or modifying the organometal halide perovskite material with a non-peripheral substituted phthalocyanine. Organometal halide perovskite materials that are coated or modified using non-peripheral substituted phthalocyanine of the invention can be used as an improved electronic component in a wide variety of electronic devices such as, but not limited to, photovoltaic devices (e.g., solar cells, photosensors, etc.), light-emitting diodes, lasers, photoelectrolysis, etc. For the sake of clarity and brevity, the present invention will now be described in reference to use of the non-peripheral substituted phthalocyanines ("nps-PCs") of the invention in perovskite solar cells. However, it should be appreciated that non-peripheral substituted phthalocyanines of the invention can be used in any electronic device that utilizes a photovoltaic component.

In some embodiments, the non-peripheral substituted phthalocyanines of the invention are hydrophobic phthalocyanines. Accordingly, non-peripheral substituted phthalocyanines of the invention provide long-term stability of PSCs to humidity and moisture. Thus, PSCs comprising the non-peripheral substituted phthalocyanine of the invention have a significantly longer stability in humid conditions compared to the same PSCs in the absence of a non-peripheral substituted phthalocyanine ("nps PC") of the invention. When referring to moisture or humidity stability of PSCs, such a determination can be made by the following procedure: storing PSCs at 25° C. at a relative humidity of 75% for a such a time and measuring the power conversion efficiency. The amount of time it can be stored to reduce the initial PCE to 50% is termed PCE half-life. By measuring PCEs for various storage time and extrapolating the data to determine PCE half-life, one can determine the hours of stability provided by the non-peripheral substituted phthalocyanines of the invention using the formula:

$$T_{Stability} = [\text{PCE half-life of PSC with a nps-PC}] - [\text{PCE half-life of PSC without nps-PC}].$$

Alternatively, one can determine the amount or % of increased stability by the following equation: % stability increase=$[(T_1-T_0)/T_0] \times 100\%$, where $T_1$=thermal stability of PSC with nps-PC and $T_0$=thermal stability of PSC without nps-PC. In some embodiments, the presence of nps-PC of the invention increases a thermal stability (% stability increase) by at least about 50%, typically by at least about 60%, and often by at least about 75% relative to the same organometal halide perovskite material in the absence of nps-PC of the invention.

Alternatively, one can express the stability based on the amount of PCE after 1000 hour of storage at the storage conditions provided above. For example, in one particular embodiment, the long-term stability of PSCs was analyzed by storing the devices at 25° C. and relative humidity of 75% for 1000 hours without encapsulation and then measuring the power conversion efficiencies of the PSCs. In some embodiments, it was found that the passivation process of the invention significantly enhanced the long-term stability of PSCs by maintaining PCE of at least about 70%, typically at least about 75%, often at least about 80%, more often at least about 85%, and most often at least about 90% of the initial PCEs of devices. Throughout this disclosure, when referring to a numerical value, the terms "about" and "approximately" are used interchangeably herein and refer to being within an acceptable error range for the particular value as determined by one of ordinary skill in the art. Such a value determination will depend at least in part on how the value is measured or determined, e.g., the limitations of the measurement system, i.e., the degree of precision required for a particular purpose. For example, the term "about" can mean within 1 or more standard deviation, per the practice in the art. Alternatively, the term "about" when referring to a numerical value can mean ±20%, typically ±10%, often ±5% and more often ±1% of the numerical value. In general, however, where particular values are described in the application and claims, unless otherwise stated, the term "about" means within an acceptable error range for the particular value, typically within one standard deviation.

In comparison, the control sample of organometal halide perovskite (i.e., without a nps-PC compound of the invention) lost its performance after only 300 hours of storing. Without being bound by any theory, it is believed that due to the hydrophobic nature of some embodiments of nps-Pc of the invention, formation of a thin Pc film on the top of perovskite layer provide a significant and effective protection against humidity.

Hydrophobic property of nps-PCs of the present invention can be readily determined and recognized using, for example, a water droplet contact angle measurement. Such a measurement can readily provide valuable information on the significance of hydrophobic nature of thin films. As discussed in detail below, the water droplet contact angles was measured for a control perovskite film (no coating), a perovskite film coated with two different nps-PCs of the invention. The control film had water droplet contact angle of 71.8°, whereas two nps-PC coated perovskite films of the invention had water droplet contact angle of 82.3° and 86.° corresponding to increase in water droplet contact angle of 14.6% and 20.8%. The % of water droplet contact angle is calculated using the formula:

% Increase={(Angle 1−Angle 0)/(Angle 0)}×100% where Angle 1=water droplet contact angle of nps-PC coated perovskite material and Angle 0=water droplet contact angle of control perovskite material (i.e., same perovskite material in the absence of a nps-PC coating). In some embodiments, the % increase in water droplet contact angle in the presence of a nps-PC of the invention is at least about 10%, typically about 15%, and often about 20%. In one particular embodiment, the presence of a nps-PC compound of the invention increases a water droplet angle measurement by at least about 14% relative to the same organometal halide perovskite material in the absence of the nps-PC of the invention.

In addition to passivating the surface defects and providing thermal and/or moisture stability of organometal halide perovskite, coating of organometal halide perovskites with a nps-PC of the invention also results in a smoother surface as measured by root mean square roughness. In some embodiments, the presence of a non-peripheral substituted phthalocyanine of the invention reduces a root mean square roughness of an organometal halide perovskite material by at least about 25%, typically by at least about 30%, and often by at least about 40% relative to the same organometal halide perovskite material in the absence of a non-peripheral substituted phthalocyanine of the invention. Alternatively, a root mean square roughness of an organometal halide perovskite material comprising a non-peripheral substituted phthalocyanine of the invention is less than about 25 nm, typically less than about 20 nm, and often less than about 10 nm.

In some embodiments, the non-peripheral substituted phthalocyanine is of the formula:

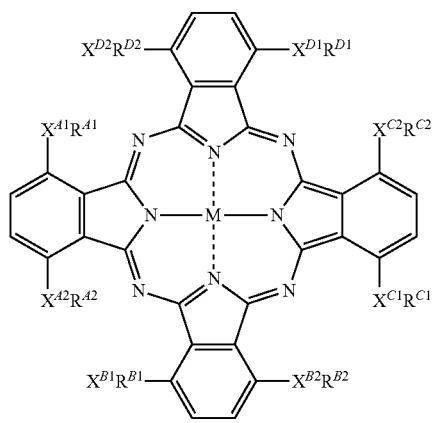

where M is Ti=O, Zn, Cu, Fe, V=O, Al—Cl, Ga—Cl, In—Cl, Al—Br, Ga—Br, or In—Br; each of $X^{A1}$, $X^{A2}$, $X^{B1}$, $X^{B2}$, $X^{C1}$, $X^{C2}$, $X^{D1}$, and $X^{D2}$ is independently S, O, or $NR^1$; each of $R^{A1}$, $R^{A2}$, $R^{B1}$, $R^{B2}$, $R^{C1}$, $R^{C2}$, $R^{D1}$, and $R^{D2}$ is independently H or $C_4$-$C_{20}$ alkyl; and each $R^1$ is independently H, $C_1$-$C_{20}$ alkyl, or a nitrogen protection group, provided at least four of $R^{A1}$, $R^{A2}$, $R^{B1}$, $R^{B2}$, $R^{C1}$, $X^{C2}$, $R^{D1}$, and $R^{D2}$ is independently $C_4$-$C_{20}$ alkyl. In some embodiments, at least six of $R^{A1}$, $R^{A2}$, $R^{B1}$, $R^{B2}$, $R^{C1}$, $R^{C2}$, $R^{D1}$, and $R^{D2}$ is independently $C_4$-$C_{20}$ alkyl. Still in another embodiment, each of $R^{A1}$, $R^{A2}$, $R^{B1}$, $R^{B2}$, $R^{C1}$, $R^{C2}$, $R^{D1}$, and $R^{D2}$ is independently $C_4$-$C_{20}$ alkyl. Yet in other embodiments, each of $X^{A1}$, $X^{A2}$, $X^{B1}$, $X^{B2}$, $X^{C1}$, $X^{C2}$, $X^{D1}$, and $X^{D2}$ is independently S or O. In one particular embodiment, $X^{A1}$, $X^{A2}$, $X^{B1}$, $X^{B2}$, $X^{C1}$, $X^{C2}$, $X^{D1}$ and $X^{D2}$ are S.

Suitable nitrogen protecting groups for nps-PC of formula I are well known to one skilled in the art of organic chemistry. Exemplary nitrogen protecting groups that are useful in nps-PC of formula I include, but not limited to, formyl, acetyl, trifluoroacetyl, benzyl, benzyloxycarbonyl (CBZ), tert-butoxycarbonyl (Boc), trimethyl silyl (TMS), 2-trimethylsilyl-ethanesulfonyl (SES), trityl and substituted trityl groups, allyloxycarbonyl, 9-fluorenylmethyloxycarbonyl (FMOC), nitro-veratryloxycarbonyl (NVOC), and the like. Other suitable nitrogen protecting groups can be found, for example, in T. W. Greene and P. G. M. Wuts, *Protective Groups in Organic Synthesis*, 3$^{rd}$ edition, John Wiley & Sons, New York, 1999, and Harrison and Harrison et al., *Compendium of Synthetic Organic Methods*, Vols. 1-8 (John Wiley and Sons, 1971-1996), which are incorporated herein by reference in their entirety.

One skilled in the art can readily prepare nps-PC compounds of the invention using schematically illustrated reaction process shown in Scheme I below:

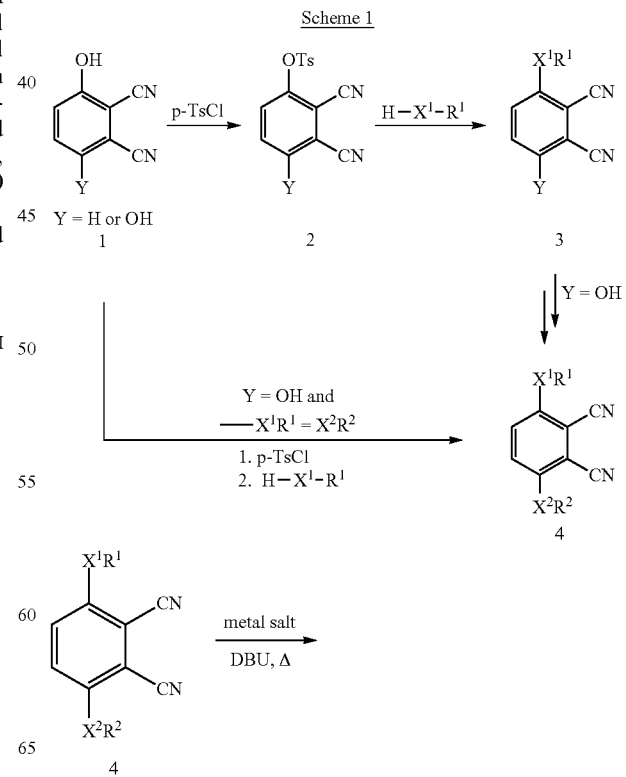

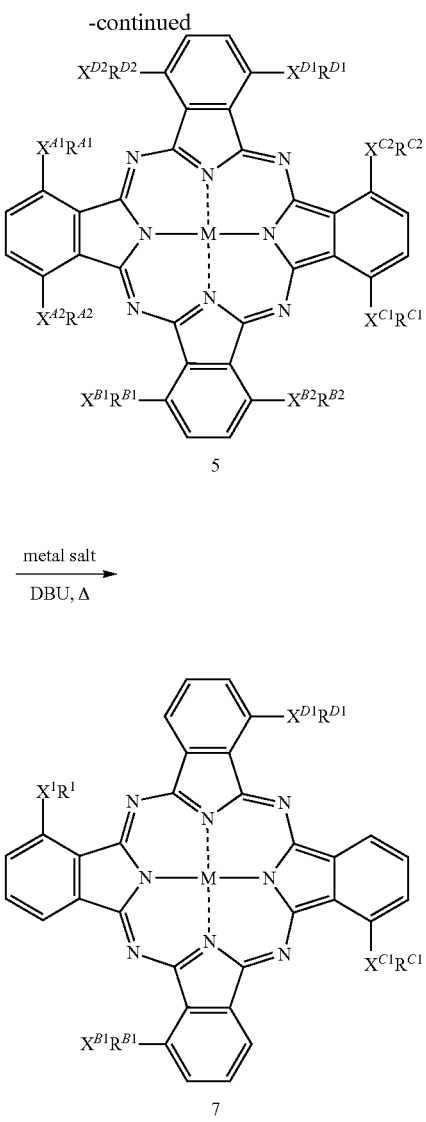

where M is Ti = O, Zn, Cu, Fe, V = O,
Al—Cl, Ga—Cl, In—Cl, Al—Br, Ga—Br, or In—Br Briefly, starting with dicyano-substituted phenol or diphenol compound 1, either a selective conversion of one of the hydroxy functional group to —X¹—R¹ (compound 3) or conversion of both hydroxy groups (i.e., —OH) to a same —X—R group (compound 4 where —X²—R² is same —X¹—R¹) can be achieved. As can be seen in Scheme 1, by using a selective and stepwise conversion of hydroxy groups allows substitution of two different —X—R groups (compound 4 where —X¹—R¹ and —X²—R² are different). As can be expected, if only one hydroxy group is present in the dicyano-substituted benzene the resulting product is compound 6.

Conversion of appropriately substituted dicyanobenzene (compound 4 or 6) to the desired nps-PC compounds is readily achieved by refluxing a mixture of compound 4 or 6 with metal salt in the presence of a base, such as DBU. By using a mixture of differently substituted compound 6 in an appropriate ratio, one can expect differently substituted nps-PC compounds of the invention. In addition, by using a mixture of differently substituted compound 4, one can produce different substituents of nps-PC compounds of the invention. Furthermore, a mixture of compounds 4 and 6 in different ratio can be used to produce nps-PC compounds having 5, 6, or 7 —X—R groups. In this manner, one skilled in the art having read the present disclosure can produce a wide variety of nps-PC compounds encompassed within the scope of the present invention.

In general, methods of the invention allow use of any organometal halide perovskite materials. In some embodiments, the organometal halide perovskite material is of the formula: $ABX_mY_{3-m}$, where A comprises $CH_3NH_3$, $C_4H_9NH_3$, $NH_2=CHNH_2$, $NH_2=C(NH_2)_2$, or a combination thereof, B is Pb, Sn, or Bi; each of X and Y is independently a halide selected from the group consisting of Cl, Br and I; and m is an integer from 1 to 3. Still in other embodiments, the organometal halide perovskite is of the formula: $Cs_a(MA_bFA_{1-b})_{1-a}Pb(I_kCl_jBr_{1-k-j})_3$, where MA is $CH_3NH_3$; FA is $NH_2=CHNH_2$; a=0.01~0.06; b=0.1~0.2; j=0.8~0.9; and k=0.8~0.9. It should be appreciated that a, b, j and k are such that the overall charge of the organometal halide perovskite is neutral.

For illustrative purposes, two nps-PC compounds with eight non-peripheral substituted n-hexylthio groups, NP—$SC_6$—TiOPc and NP—$SC_6$—ZnPc, will now be described. However, it should be appreciated that the scope of the invention is not limited to these two nps-PC compounds. Two nps-PC compounds NP—$SC_6$—TiOPc and NP—$SC_6$—ZnPc were synthesized as illustrated in Scheme 1 above and as detailed in the Examples section. Without being bound by any theory, it is believed that coating of an organometal halide perovskite with a nps-PCs compounds of the invention results in interaction with under-coordinated $Pb^{2+}$ and passivation of Pb—I antisite defects. The presence of S, O and N atoms in nps-PCs of the invention, possessing lone electron pairs, in the structure of the two illustrative example nps-PCs compounds of the invention, enhanced the coordinating power toward $Pb^{2+}$ ions, and improved their passivating ability. These unique merits of nps-PCs of the invention, along with their p-type semiconducting and high charge transport and conductance properties, make them as excellent candidates for passivating the perovskite layer, to achieve higher thin film quality, and ultimately better performance for PSCs. The nps-PCs of the invention infiltrated into the perovskite film through a mixed anti-solvent. The characterizations indicated that nps-PCs of the invention successfully passivated the perovskite surface, and in case of NP—$SC_6$—TiOPc, dope into perovskite grains. Accordingly, in some embodiments a nps-PC of the invention can be used as a doping agent to produce a modified organometal halide perovskite.

Perovskite passivation by a nps-PC of the invention efficiently reduced the deep trap density and enhanced the charge extraction at perovskite/hole-transfer material ("HTM") interface. DFT calculation were also conducted to get further insight to the interactions between the nps-PCs of the invention and $Pb^{2+}$ ions. The PSCs with modified perovskite layers (i.e., perovskite materials of the present invention) exhibited better performances with highest PCEs of 19.39% and 18.04% for NP—$SC_6$—TiOPc and NP—$SC_6$—ZnPc based devices, respectively, compared with the control devices without post-treating the $MAPbI_3$ films (PCE of 17.67%). More interestingly, the enhanced stability against moisture and heating were accomplished. Devices based on NP—$SC_6$—TiOPc showed the highest thermal stability with only 17.3% decrease in efficiency from room temperature to 200° C., while the control device lost around 67% of its performance during the temperature rising process.

The nps-PC compounds of the invention showed good solubility in common organic solvent, allowing these compounds to be used in solution-based film deposition methods. In one particular embodiment, MAPbI$_3$ was selected as the light absorbing material in n-i-p structured planar PSCs, where the perovskite layers were deposited through one-step method. The nps-PCs of the invention was introduced as passivating agents by dripping anti-solvent containing the nps-PC of the invention (at concentration of 0.5 mg/mL) onto perovskite wet layer during the spin coating process. The adsorption behaviors of nps-PCs of the invention (NP—SC$_6$—ZnPc and NP—SC$_6$—TiOPc) on the three-layer MAPbI$_3$ surface were systematically investigated using first-principles calculations. In the DFT calculations, the organic group —C$_6$H$_{13}$ of phthalocyanine molecules is replaced by —H for simplification. Results showed that both NP—SC$_6$—ZnPc and NP—SC$_6$—TiOPc molecules prefer to adsorb on the Pb—I$_2$-terminated surface. Moreover, both NP—SC$_6$—ZnPc and NP—SC$_6$—TiOPc molecules tend to get closer to surface Pb atoms, and the adsorption energies increased by 0.38 eV and 0.41 eV, respectively, when NP—SC$_6$—ZnPc and NP—SC$_6$—TiOPc molecules point to the I atoms of MAPbI$_3$. In addition, the calculation showed NP—SC$_6$—TiOPc molecules interact strongly with the MAPbI$_3$ surface by forming strong O—Pb bonds with the bond length of 2.34 Å, which may play a crucial role for NP—SC$_6$—TiOPc adsorption on the MAPbI$_3$ surface. The adsorption energies per NP—SC$_6$—ZnPc and NP—SC$_6$—TiOPc on the MAPbI$_3$ (001) surface are −3.36 eV and −3.61 eV, respectively, indicating that NP—SC$_6$—TiOPc molecules are more efficient to adsorption on the MAPbI$_3$ surface.

The distribution of nps-PC molecules into the passivated perovskite films was investigated using an energy dispersive X-ray spectroscopy (EDS) mapping coupled with an SEM. The results demonstrated that NP—SC$_6$—TiOPc successfully doped into the grains of perovskite film and thus a full surface and grain passivation were achieved. However, it was clearly revealed that the contents of S and Zn significantly decreased from the surface to the depth of perovskite film, indicating only a partial grain passivation with a complete surface passivation of perovskite by NP—SC$_6$—ZnPc molecules. This strongly confirm the higher passivating capability of NP—SC$_6$—TiOPc material, compared with NP—SC$_6$—ZnPc. Without being bound by any theory, this higher passivating activity by NP—SC$_6$—TiOPc is believed to be achieved due to the presence of an oxygen atom in the axial position of the metal center, which can offer a higher chance for Lewis acid-base interaction between the NP—SC$_6$—TiOPc molecules and the under coordinated Pb$^{2+}$ sites.

Figure 2:
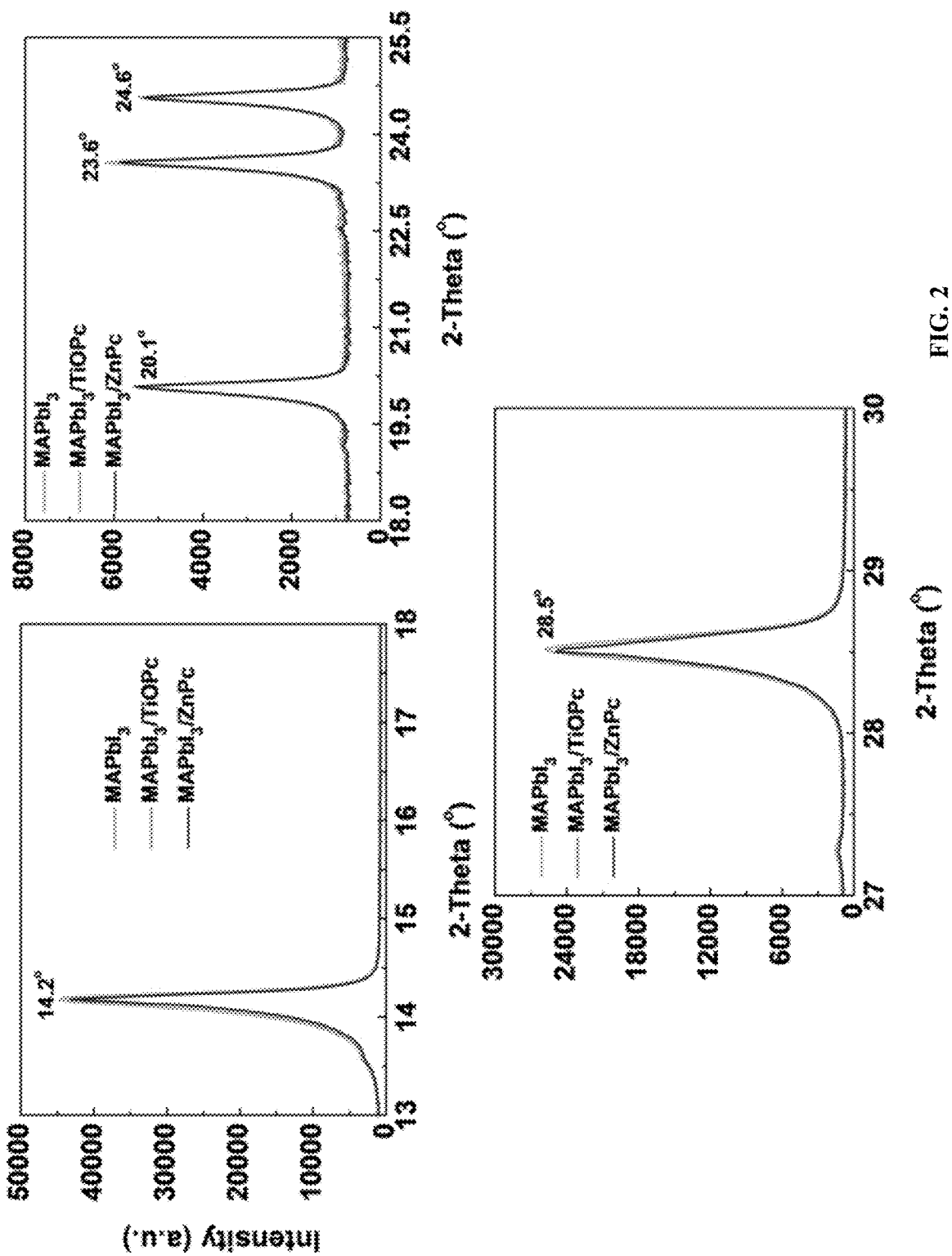
FIG. 2 is XRD patterns of control $MAPbI_3$ and passivated $MAPbI_3$/ZnPc and $MAPbI_3$/TiOPc films at various 2 Theta (°).

X-ray diffraction (XRD) characterization was conducted to study whether nps-PCs of the invention can affect the crystal structure of the MAPbI$_3$ perovskite, (FIG. 1 and FIG. 2). The XRD patterns of the pristine MAPbI$_3$, MAPbI$_3$/TiOPc and MAPbI$_3$/ZnPc films are presented in FIG. 1a. All the samples exhibited strong diffraction peaks of 14.2°, 20.1°, 23.6°, 24.6° and 28.5°, which are mainly due to diffraction from the (110), (112), (211), (202) and (220) planes of the tetragonal phase MAPbI$_3$ lattice, respectively. However, only sample MAPbI$_3$ exhibited a clearly identified peak at ~12.7°, which corresponds to the diffraction angle of PbI$_2$ (001) lattice plane (FIG. 1b). This indicates that a trace amount of PbI$_2$ was produced in the MAPbI$_3$ film for this sample. While such a trace amount of PbI$_2$ was not observed for samples of MAPbI$_3$/TiOPc and MAPbI$_3$/ZnPc. FIG. 1c illustrates the normalized XRD curves from 13.6° to 14.4°. It can be seen that the XRD patterns of the MAPbI$_3$/TiOPc and MAPbI$_3$/ZnPc films exhibit almost equivalent full width at half maximum (FWHM) values, while the FWHM becomes broader in the XRD pattern of the pristine MAPbI$_3$ film, indicating its smaller grain size. The wider FWHM indicates that the grain size is smaller in the pristine perovskite film, which is in good agreement with the result of the cross-sectional SEM images. In addition, the observed shift of the peak at 14.2° for passivated perovskite films suggested that the introduction of large nps-PC molecules of the invention to perovskite lattice can induce the unit cell expansion. The peak at 26.6° correlated with π-π stacking interactions between nps-PC molecules, with face-on orientation toward the underlying perovskite layer, which is well-known as the favorable molecular alignment for the purpose of charge extraction and transport abilities of the phthalocyanine (Pc) thin films formed on the top of the perovskite layer.

Figure 3:
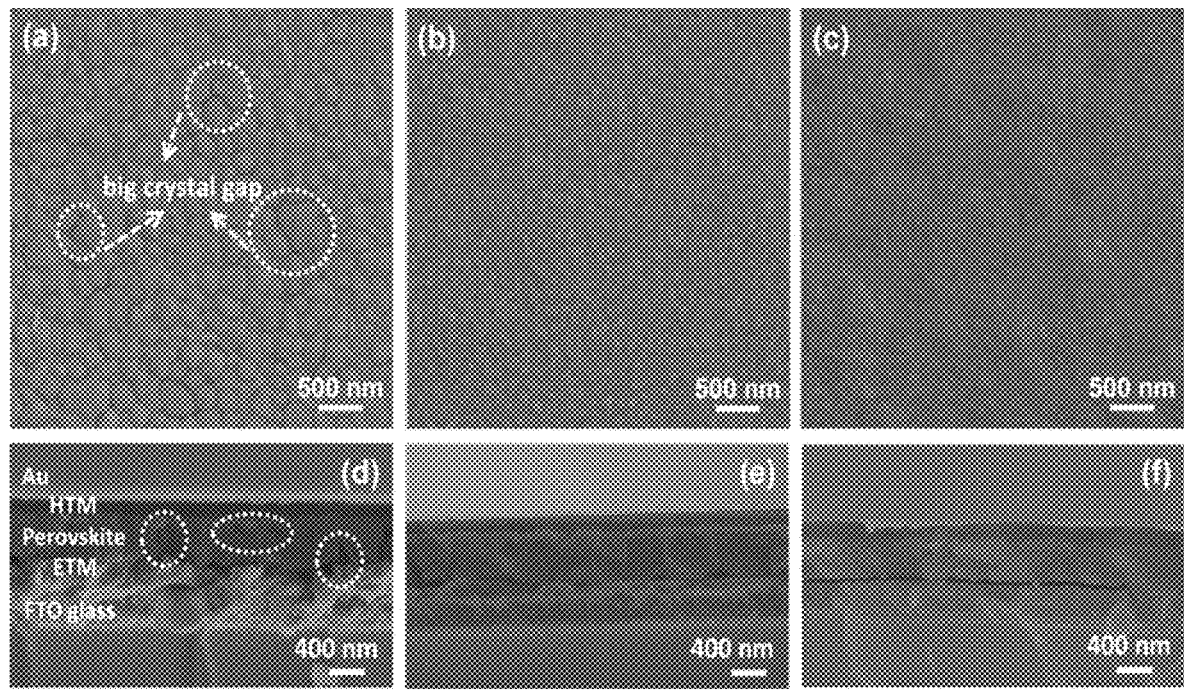
FIG. 3 is various SEM images. Panels a and d are top view and cross-sectional SEM images of pristine perovskite. Panels b and e are SEM images of MAPbI$_3$/TiOPc. Panels c and f are SEM images of MAPbI$_3$/ZnPc films.

FIG. 3 shows the top view and cross-sectional SEM images for pristine MAPbI$_3$, and passivated MAPbI$_3$/TiOPc and MAPbI$_3$/ZnPc films. It should be noted that the obtained surface images for MAPbI$_3$/TiOPc and MAPbI$_3$/ZnPc films exhibit the morphology of Pc thin films, composed of small irregular particles. However, from the top view SEM image of the pristine perovskite film, the incomplete coverage with visible pinholes and voids, due to the big crystal gaps, can be detected (FIG. 3a). Whereas methods of the invention clearly result in a condensed and uniform Pc film formed on the top of perovskite layer (FIGS. 3b and c).

Figure 4:
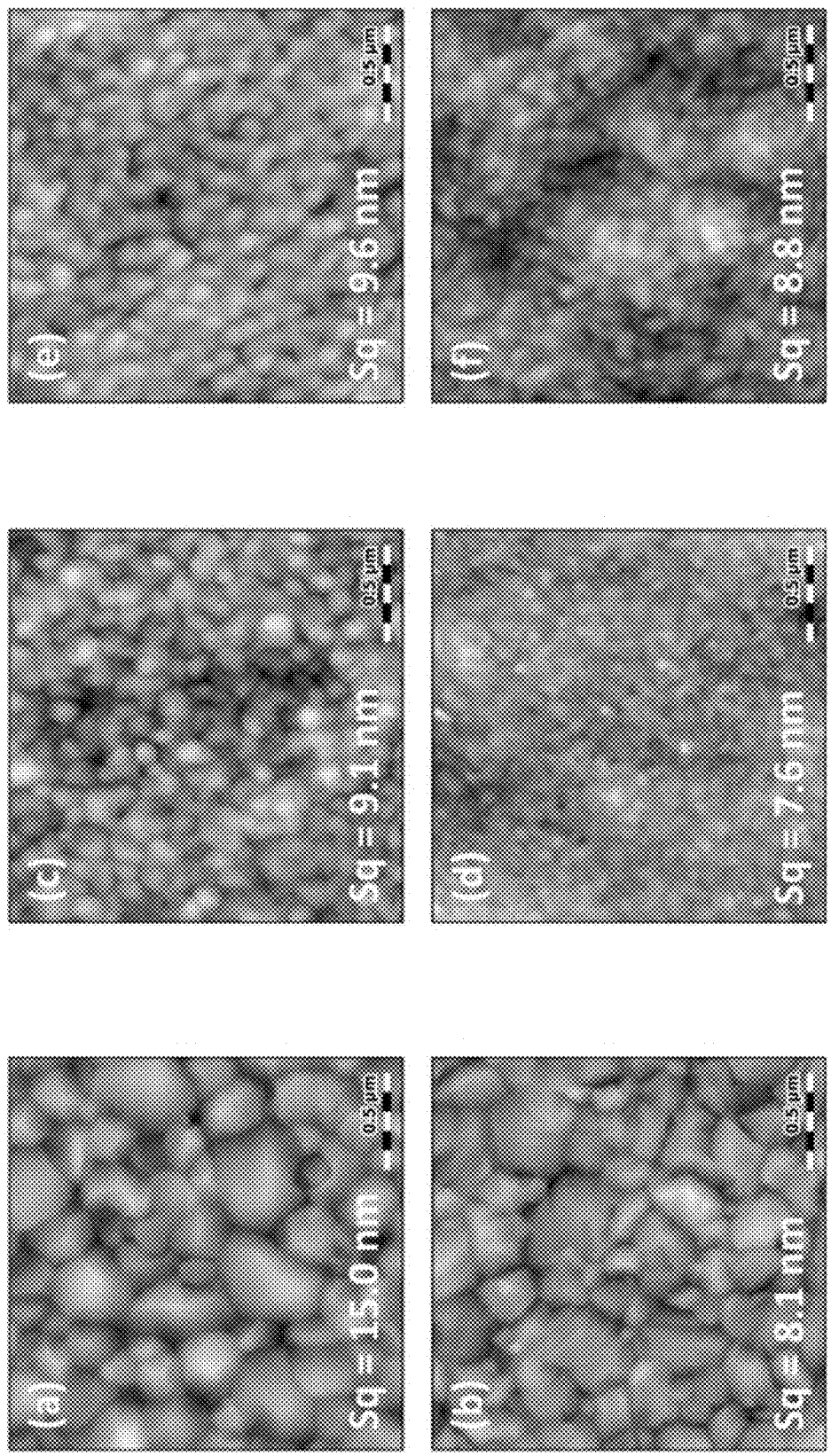
FIG. 4 is AFM images of MAPbI$_3$ (a) before and (b) after washing with chlorobenzene ("CB"); MAPbI$_3$/TiOPc (c) before (d) and after washing by CB; MAPbI$_3$/ZnPc films (e) before and (f) after washing by CB.

The cross-sectional SEM images indicate more continuous films with larger grain size for the passivated perovskite layers, in comparison with the pristine MAPbI$_3$ film. According to the results of XRD and SEM, it can be concluded that nps-PC molecules of the invention do not change the perovskite crystal structure but affect the perovskite growth. Subsequently, atomic force microscopy (AFM) was employed to further study the morphologies of the pristine perovskite film and the perovskite layer covered by MAPbI$_3$/TiOPc and MAPbI$_3$/ZnPc (FIG. 4). To achieve high performance devices, deposition of thin films with the least defects and surface roughness is essential. Regarding the AFM images, the root-mean-square (RMS) roughness of the perovskite film (15.0 nm) decreased due to the deposition of compact and smooth films of MAPbI$_3$/TiOPc and MAPbI$_3$/ZnPc (9.1 and 9.6 nm, respectively). AFM images of the bare and passivated perovskite films after washing with chlorobenzene confirmed the minimum changes in the morphology of the films, which can be beneficial for further solution process of organic HTM layer fabrication.

Figure 5:
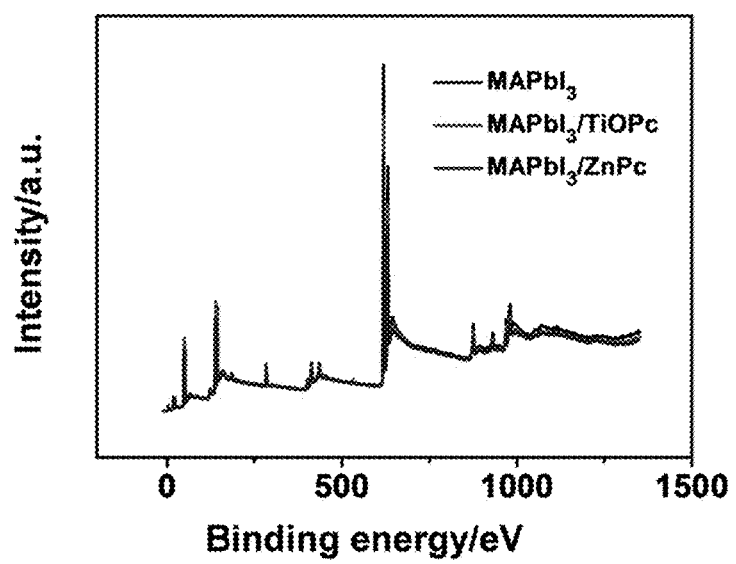
FIG. 5 is a full XPS scan survey spectra of perovskite samples.
Figure 6:
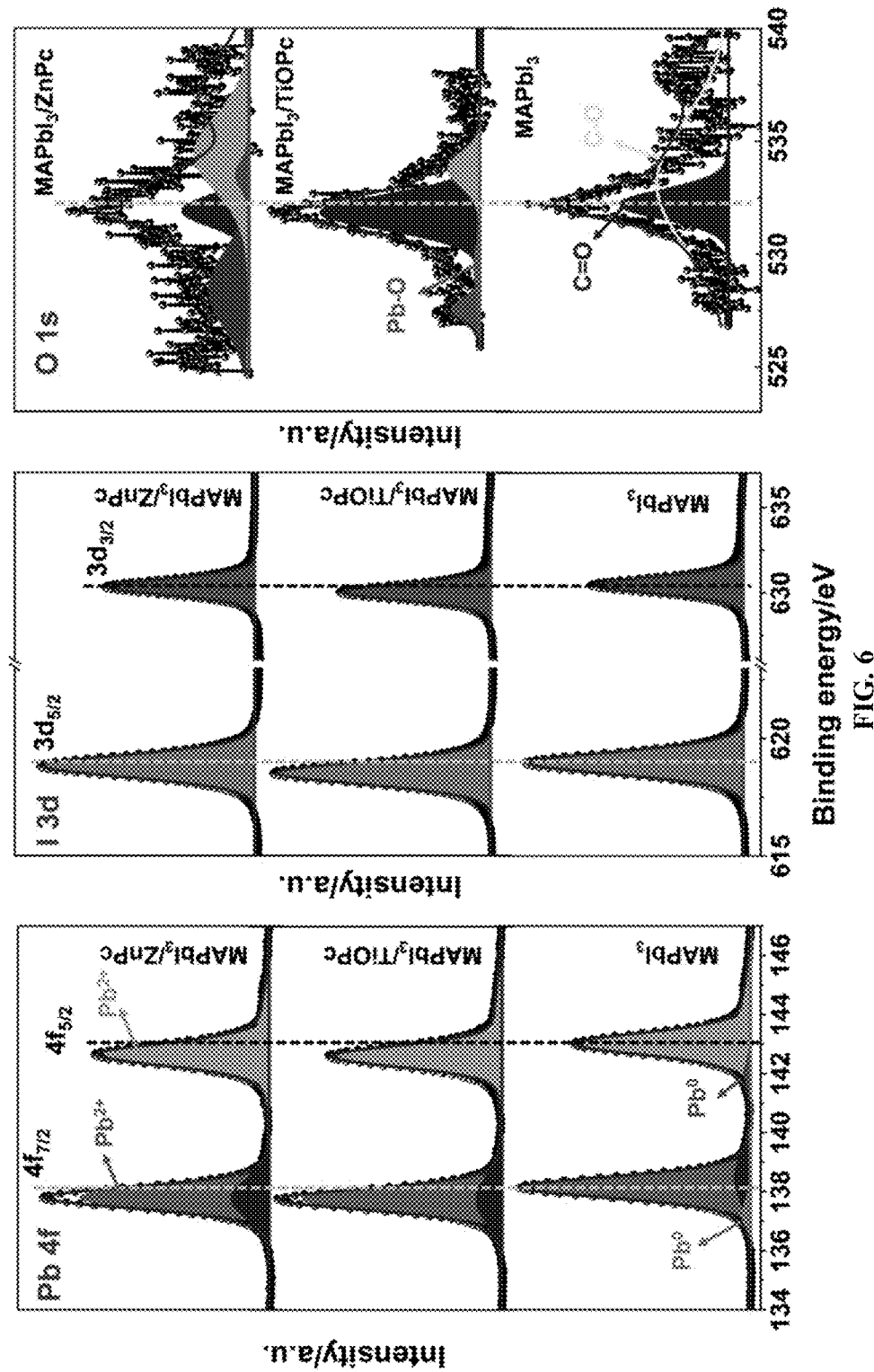
FIG. 6 is XPS deconvoluted spectrum of Pb, I and O of bare perovskite and phthalocyanines doped perovskite.

X-ray photoelectron spectroscopy (XPS) measurement was carried out to investigate the interaction between phthalocyanine and perovskite. The full scan survey spectra are given in FIG. 5. As can be seen in FIG. 6, the core-level spectrum of Pb 4f in the bare perovskite shows two dominates peak located at 138.2, and 143.1 eV are corresponding to the Pb$^{2+}$-4f$_{7/2}$ and Pb$^{2+}$-4f$_{5/2}$, respectively. In contrast, after doping with NP—SC$_6$—TiOPc and NP—SC$_6$—ZnPc, the Pb$^{2+}$ peaks were shifted to lower binding energy (137.7 and 142.6 eV), which indicates the significant coordination between the bare perovskite and phthalocyanines. Besides, the two small peaks at 137.1 and 141.8 eV can be seen in the bare perovskite due to the existence of unsaturated Pb assigned to metallic Pb clusters (Pb$^0$). Interestingly, after Pc passivation, the metallic Pb peaks were disappeared as the results of better coordination effect between the Pb$^{2+}$ and phthalocyanines, which confirms that the Pc molecules can able to suppress the metallic Pb formation and avoids the nonradiative recombination process.

Moreover, the negative shifts of I 3d binding energy ($3d_{5/2}$ and $3d_{3/2}$) can be observed after introducing Pc materials into $MAPbI_3$, indicates the Lewis acid (Ti and Zn) coordination with Lewis base I ions. From the core-level spectra of Pb 4f and I 3d, the estimated Pb:I ratio for the bare perovskite was 1:3.44. After modification with Pc compounds, the ratio of Pb:I was significantly increased to 1:3.46 and 1:3.53 for NP—$SC_6$—ZnPc and NP—$SC_6$—TiOPc, respectively, which confirms the lesser iodine deficit from the passivation effect. Thus, the interaction between the Pc and perovskite, especially NP—$SC_6$—TiOPc with $MAPbI_3$, is beneficial to decrease the number of trap states, resulting in higher efficiency. To further explore the possible origin of the higher efficiency of NP—$SC_6$—TiOPc compound, the deconvoluted O is spectrum is shown in FIG. 6. The intensive coordination effect of NP—$SC_6$—TiOPc with $MAPbI_3$ was validated by the existence of the Pb—O component at 529.3 eV and a stronger C=O peak at 531.7 eV. It is believed that the NP—$SC_6$—TiOPc may cause the oxidation of $Pb^0$ to $Pb^{2+}$ and significantly reduce the decomposition of perovskite. The deconvoluted nitrogen spectrum of $MAPbI_3$ exhibited the N1 peak 401.9 eV, which is good agreement with the previously reported literature. After passivation with Pc materials, the N1 peak at 401.9 eV was shifted to lower binding energy (401.6 eV), indicating a strong coordination effects between the perovskite and NP—$SC_6$—ZnPc, and NP—$SC_6$—TiOPc molecules. The passivated samples also showed a small peak at 399.6 eV, which is associated with two groups of four nitrogen atoms in NP—$SC_6$—TiOPc and NP—$SC_6$—ZnPc. The core-level spectrum of S 1 s also validated the passivation effect as the resulting from the lower binding energy shift of $S^2p_{3/2}$ peak. In line with the EDS mapping outcomes, the overall XPS results also confirm the superior passivation effect of NP—$SC_6$—TiOPc on $MAPbI_3$, which could effectively suppress the trap densities of the bare perovskite film.

Figure 7:
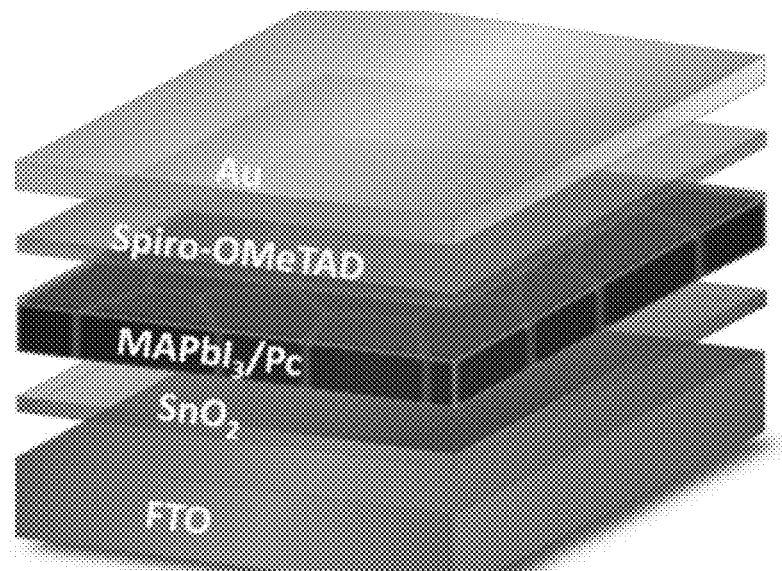
FIG. 7 is a schematic illustration of a one embodiment of structure of PSC comprising a nps-PC compound of the invention.

PSCs with the $FTO/SnO_2/MAPbI_3/Spiro-OMeTAD/Au$ configuration (FIG. 7), based on pristine and passivated perovskite films were fabricated. It is expected that the lone pair electrons on S, O and N atoms in TiOPc and ZnPc molecules, could act as Lewis bases and interact with $Pb^{2+}$ sites on perovskite layer, offering an efficient passivation effect. The current density-voltage (J-V) characteristics of the prepared PSCs were measured under AM 1.5 G simulated solar light (100 mW $cm^{-2}$) with 0.11 $cm^2$ of aperture size. The photovoltaic parameters for the best performing PSCs, along with their average values are shown in Table 1.

TABLE 1

The photovoltaic parameters for devices based on pristine and doped perovskite film (the highest values are presented in the parentheses).

| Perovskite | $J_{sc}$ (mA/$cm^2$) | $V_{oc}$ (V) | FF (%) | PCE (%) |
|---|---|---|---|---|
| Bare perovskite | 21.34 ± 0.92 (22.96) | 1.070 ± 0.009 (1.08) | 69.22 ± 1.57 (71.26) | 15.82 ± 0.96 (17.67) |
| Doped with NP-$SC_6$-ZnPc | 22.16 ± 0.76 (23.18) | 1.076 ± 0.011 (1.09) | 69.70 ± 1.76 (71.40) | 16.62 ± 0.70 (18.04) |
| Doped with NP-$SC_6$-TiOPc | 22.50 ± 0.51 (23.27) | 1.117 ± 0.006 (1.12) | 73.60 ± 0.74 (74.40) | 18.49 ± 0.43 (19.39) |

According to the results, devices with the passivated perovskite films exhibited enhanced performances, with the highest efficiencies reaching 19.39% and 18.04% for devices employing $MAPbI_3$/TiOPc and $MAPbI_3$/ZnPc, respectively, which are much higher than the best value of the pristine perovskite-based devices (15.82%). Compared to PSCs without passivation, higher open circuit voltage ($V_{OC}$), $J_{SC}$ and fill factor (FF) values were obtained for both the passivated devices. As discussed earlier, Pc passivation method could improve the coverage, crystallinity and grain size of the perovskite thin film, leading to a better hole extraction ability and charge mobility for it, which can be considered as the origin of the enhanced performance of the passivated PSCs. This was further confirmed by steady-state photoluminescence (PL) and time-resolved photoluminescence (TRPL) measurements. Perovskite samples on FTO glass without hole and electron transporting layers were fabricated for this measurement. The PL peaks of the samples are observed around 775 nm; however, the PL intensity of the passivated perovskite layers are significantly higher than that of the pristine one, demonstrating that the non-radioactive charge recombination is considerably suppressed in the passivated perovskite films. It is suggested that the successful surface passivation of the perovskite film by the Pc molecules could efficiently decrease the trap state density. In addition, as the GBs are considered as the main centers for non-radiative recombination in perovskite films, the highest increasing PL intensity for the passivated film based on NP—$SC_6$—TiOPc can imply the effective role of the employed Pc material on passivation of GBs. To support this hypothesis, TRPL measurements were carried out on the prepared samples, and a bi-exponential decay function was used to fit their PL decay time ($\tau_i$) and the amplitude ($A_i$). There are two typical channels for recombination, with either the fast ($\tau_1$) or the long decay time ($\tau_2$), associated to quasi-monomolecular deep-trap assisted non-radiative recombination, and bimolecular radiative recombination of the photogenerated carriers, respectively. It is well-known that the processes of the non-radiative carrier recombination on a layer surfaces, mainly affecting the fast PL decay time, whereas the bulk recombination rates control the slow decay time. The calculated parameters are listed in Table 2.

TABLE 2

Summary of the parameters from fitting to the TRPL measurement data.

| Perovskite | $A_1$ | $\tau_1$ (ns) | $A_2$ | $\tau_2$ (ns) | $\tau_{avg}$ (ns)* |
|---|---|---|---|---|---|
| $MAPbI_3$ | 0.43409 | 5.22722 | 0.58349 | 94.92203 | 91.39199 |
| $MAPbI_3$/ZnPc | 0.3299 | 10.06676 | 0.69365 | 90.59549 | 86.55336 |
| $MAPbI_3$/TiOPc | 0.36668 | 18.60014 | 0.71429 | 124.67603 | 117.13008 |

$$*\tau_{avg} = \frac{\sum A_i \tau_i^2}{\sum A_i \tau_i}$$

Regarding the TRPL results, faster PL decay process was observed for the pristine perovskite layer. While the PL lifetimes for the pristine perovskite films were calculated as $\tau_1$=5.22 ns and $\tau_2$=94.92 ns, prolonged lifetimes were obtained due to passivating the perovskite film by NP—$SC_6$—ZnPc ($\tau_1$=10.07 ns and $\tau_2$=90.60 ns) and NP—$SC_6$—TiOPc ($\tau_1$=18.60 ns and $\tau_2$=124.68 ns). Employing NP—$SC_6$—ZnPc and NP—$SC_6$—TiOPc materials as passivating agents could considerably enhance the $\tau_1$ value, confirming the positive impact of the both developed Pc materials in passivation of perovskite layer surface.

However, an improvement on $\tau_2$ was only observed when NP—SC$_6$—TiOPc was utilized for passivation of the perovskite thin film, showing the diffusion of NP—SC$_6$—TiOPc molecules to the depth of perovskite film, and inside the grains during the passivation, and lowering the bulk film trap states density. The average lifetime ($\tau_{avg}$) of the samples were also calculated based on the following equation, which reveals the excited-state decay and free carrier recombination dynamics in the perovskite thin film.

$$\tau_{avg} = \frac{\sum A_i \tau_i^2}{\sum A_i \tau_i} \quad (1)$$

Using equation (1), an average carrier lifetime of 91.44 ns was achieved for the pristine perovskite layer, while the average lifetime values for the passivated films were 86.55 and 117.13, for NP—SC$_6$—ZnPc and NP—SC$_6$—TiOPc, respectively. This further confirm the successful passivating both surface and GBs of the MAPbI$_3$ thin film by NP—SC$_6$—TiOPc, which offered an improved quality and coverage for the perovskite layer, leading to the lowest amount of non-radiative recombination. This directly relates to the observed highest photocurrent density for the NP—SC$_6$—TiOPc based PSC (0.34 and 1.16 mA/cm$^2$ higher than those of PSCs employing MAPbI$_3$/ZnPc and pristine perovskite, respectively). It is worth noting that the better performance of PSCs employing NP—SC$_6$—TiOPc as the passivating agent, compared to the ones with NP—SC$_6$—ZnPc is in total agreement with all the results obtained from SEM, XRD, PL and TRPL measurements.

The hysteresis of the PSCs were also measured by scanning the applied voltage in reverse and forward directions. It can be observed that compared to PSCs based on bare perovskite, the passivated devices showed negligible hysteresis, which could be due to the impact of passivation strategy on improving perovskite/HTM interface and subsequently, the presence of less accumulated charges at the interfaces. The incident photon to electron conversion efficiency (IPCE) data revealed that passivation of the perovskite layer with Pc compounds enhanced the light harvesting of the devices. The increase in J$_{SC}$ values due to introducing Pc molecules to perovskite was also validated by IPCE curves of the fabricated PSCs utilizing MAPbI$_3$/TiOPc and MAPbI$_3$/ZnPc films, with the observed integrated current values of 22.9 and 22.5 mA/cm$^2$, respectively. The steady-state efficiency and photocurrent density of the PSC based on MAPbI$_3$/TiOPc film was measured at the maximum power point (0.90V). The obtained values were very close to that of measured by J-V scan. The steady-state measurement results for PSCs based on bare perovskite and MAPbI$_3$/ZnPc films were also measured. Whilst, only a slight decrease (0.08%) in the PCE was observed for the MAPbI$_3$/TiOPc based device, PSCs employing pristine and MAPbI$_3$/ZnPc passivated perovskite layers showed more considerable drops in their efficiencies during the steady-state measurement (0.75 and 0.12%, respectively).

Figure 8:
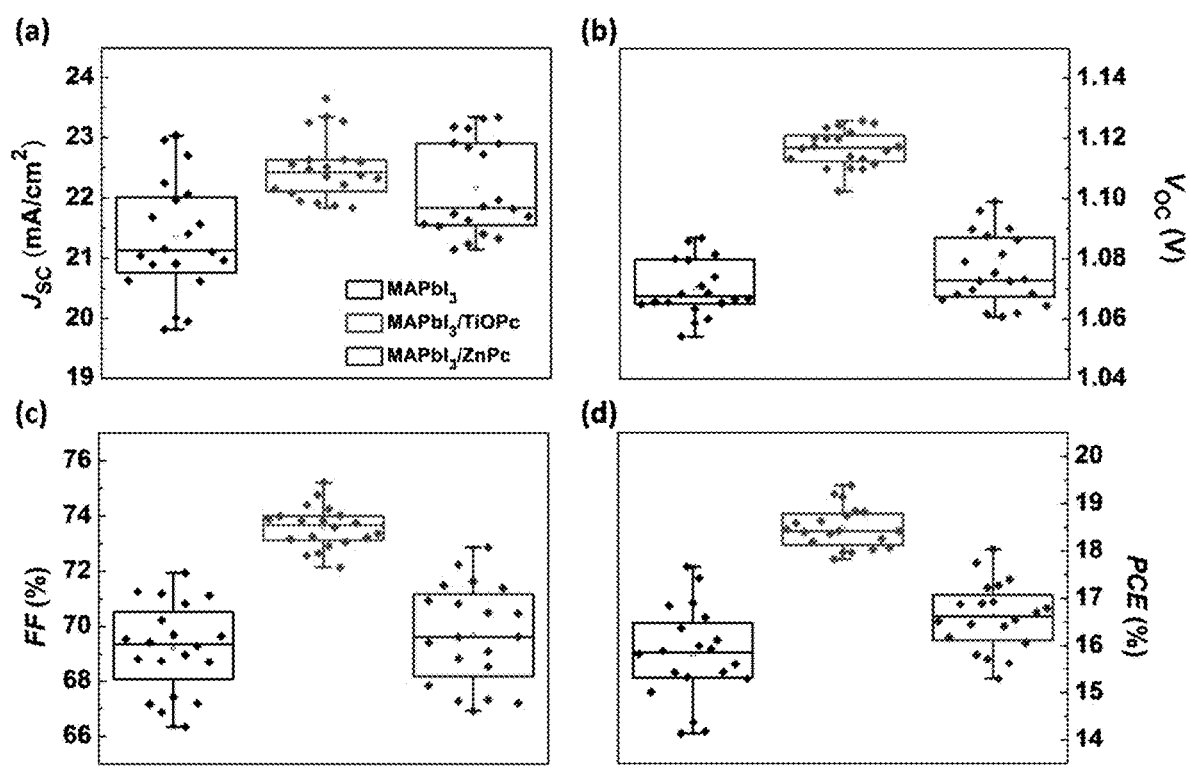
FIG. 8 is a graph of the statistics for the photovoltaic parameters, including PCE, VOC, JSC, and FF, of 20 devices fabricated from the same batch.

Electrochemical impedance spectroscopy (EIS) measurements was performed to get further insight into the recombination mechanisms occurring in PSCs based on pristine and doped MAPbI$_3$ films. All PSCs were tested in the dark with 0 V bias. The displayed low frequency arcs contain information about the charge recombination characteristics occurring at interface, and the larger semicircle represents a higher level of resistance for charge recombination, and a better charge transport through interfaces. The observed recombination resistance for devices are in the following order: MAPbI$_3$/TiOPc>MAPbI$_3$/ZnPc>pristine MAPbI$_3$. This could be related to the higher FF value observed for the MAPbI$_3$/TiOPc based PSC, in comparison with devices using MAPbI$_3$/ZnPc based and the pristine perovskite films, as FF is mainly determined by the charge transfer and transport resistance within the device. Regarding the dark current measurements for the PSCs, a lower dark current was observed for the MAPbI$_3$/TiOPc based PSCs, demonstrating a suppressed current leakage and reduced rate of charge recombination of the NP—SC$_6$—TiOPc passivated device, which was reflected in its higher open circuit voltage (41 and 47 mV higher than those of PSCs employing MAPbI$_3$/ZnPc and pristine perovskite, respectively). Moreover, both PSCs with Pc passivation showed reduced hysteresis in their dark current J-V characteristics, demonstrating the mitigated surface traps, or/and ionic motion in the perovskite film surface with passivated Pb$^{2+}$ ions. It is well known that the perovskite crystals are susceptible to defect formation, and reducing or healing such defects is considered as a successful tactic to increase the V$_{OC}$ of the PSCs, as well as their operational stability. The statistics for the photovoltaic parameters, including PCE, VOC, JSC, and FF, of 20 devices fabricated from the same batch were measured. FIG. 8. A significantly higher reproducibility was achieved for devices based on the passivated perovskite layer, and especially the MAPbI$_3$/TiOPc, which is particularly crucial in the future commercialization of PSCs. This is likely originated from the high quality and coverage of the passivated perovskite thin films.

Figure 9:
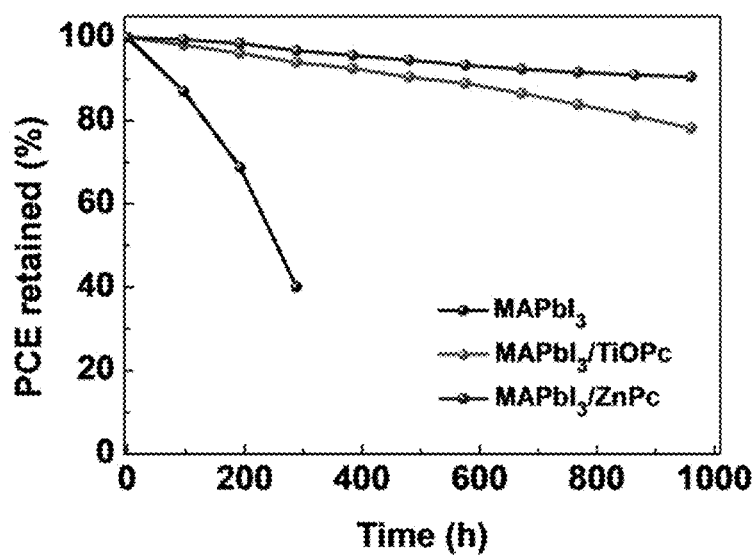
FIG. 9 is a graph showing long-term stability (at 25° C., 75% relative humidity) of the one particular embodiment of a PSC device of the invention.

Long-term stability of the PSCs was analyzed by storing the devices at 25° C. and relative 75% humidity for 1000 hours without encapsulation (FIG. 9). The passivation process could impressively enhance the long-term stability of PSCs by maintaining almost 90% and 80% of the initial PCEs of devices based on MAPbI$_3$/TiOPc and MAPbI$_3$/ZnPc, respectively. Whereas, the control device without passivation lost its performance after only 300 hours of storing. Due to the hydrophobic nature of Pc materials, formation of a thin Pc film on the top of perovskite layer can effectively protect it against humidity. Water droplet contact angle measurement can provide valuable information on the hydrophobicity of thin films. The water droplet contact angles of 71.8°, 82.3° (14.6% increase) and 86.7° (20.75% increase) were obtained for pristine perovskite, and NP—SC$_6$—TiOPc and NP—SC$_6$—ZnPc passivated perovskite films, respectively, confirming higher hydrophobicity of the passivated films. To further investigate the stability of PSCs against humidity, the as-fabricated devices based on perovskite films with and without Pc passivation were placed in water directly. A color change from black to yellow was observed for all the perovskite film, demonstrating the perovskite decay process. However, this color change was much slower for the passivated perovskite films, and particularly for MAPbI$_3$/TiOPc film, compare with the control one. After 60 seconds of being exposed to high moisture level, both bare perovskite and MAPbI$_3$/ZnPc films lost the majority of their dark color, turning to a light-yellow film, while the MAPbI$_3$/TiOPc film could significantly resist against the humidity. Formation of the highly hydrophobic Pc interlayers could significantly enhance the moisture resistance of the perovskite layer, which is critically beneficial to the long-term stability of the devices.

Figure 10:
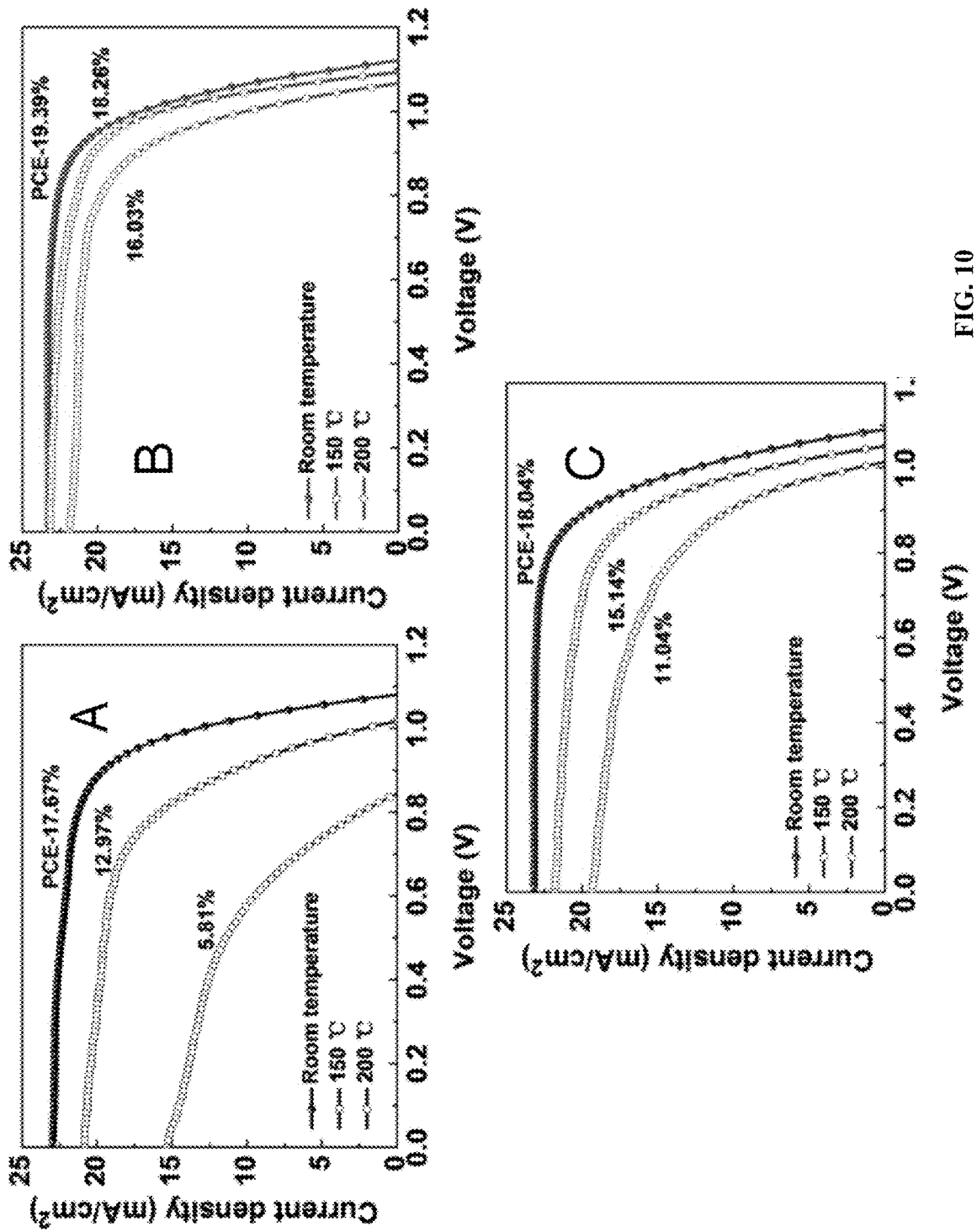
FIG. 10 shows thermal stability results for PSCs based on (A) pristine MAPbI3, (B) MAPbI3/TiOPc, and (C) MAPbI3/ZnPc films.

To scrutinize the thermal stability of the passivated PSCs, performance of the devices was monitored under different operational temperatures (FIGS. 10A-C). Elevating from room temperature first to 150° C. and then up to 200° C., the control PSC exhibited a significant drop in efficiency, from 17.67% to 12.97% at 150° C. and finally to 5.81% at 200° C., losing around 67% of its initial PCE. On the other hand, both passivated devices could show an interestingly high resistance against the elevated temperature, keeping their efficiencies even at a very high temperature of 200° C. Our champion PSC with passivated perovskite film by NP—$SC_6$—TiOPc maintained more than 80% of its initial performance under the harsh thermal condition of 200° C. It is most likely that thermal decomposition of perovskite layer starts at the defects states on the surface or GBs due to non-ideality in structure. Therefore, passivating the perovskite film by thermally stable Lewis base Pc materials can be the origin of its improved thermal stability.

As disclosed herein, nps-PC molecules of the invention are useful passivating agent for organometal halide perovskite materials. The nps-PC compounds of the invention can be applied to organometal halide perovskite materials using, for example, an anti-solvent dripping process. Methods of the invention for passivating organometal halide perovskite materials enhance the perovskite performance from average PCE of 15.82% for control PSCs with no passivation to average PCE of 18.49% for passivated devices with NP—$SC_6$—TiOPc. The surface and grain dual passivation achieved by introducing nps-PC compounds of the invention resulted in perovskite films with higher quality and coverage, and larger grain size with less voids through the thickness of the film. For compound of Formula I, where M is TiO, the presence of O as the axial ligand in the structure of the Pc molecule resulted in its higher capability to interact with the perovskite layer, both at the surface and through the thickness. Furthermore, passivation of the perovskite film by hydrophobic and thermally stable Pc materials significantly enhance the device long-term stability against moisture and heating. Under a harsh thermal condition of 200° C., devices passivated using nps-PC compounds of the invention exhibited a considerable resistance against heat and maintained the majority of their initial performance. By utilizing low-cost and highly stable nps-PC compounds of the invention as passivating agents, PSCs with remarkable photovoltaic performance and prolonged lifetime can be produced.

Additional objects, advantages, and novel features of this invention will become apparent to those skilled in the art upon examination of the following examples thereof, which are not intended to be limiting. In the Examples, procedures that are constructively reduced to practice are described in the present tense, and procedures that have been carried out in the laboratory are set forth in the past tense.

EXAMPLES

Materials: Unless specified otherwise, all materials were used as received. Organic solvents and Ti(iOPr)$_4$ and ZnCl$_2$ were purchased from Sigma-Aldrich. CH$_3$NH$_3$I and PbI$_2$ were purchased from Xi'an Polymer Light Technology Corp. (Xian, China). Hexane-1-thiol, 2,3-dicyanohydroquinone, p-toluenesulfonyl chloride and potassium carbonate were purchased from Sigma-Aldrich. 1,8-Diazabicyclo-[5,4,0]-undec-7-ene (DBU) was obtained from TCI (Shang Hai, China).

Synthesis of Pcs: The synthesis of NP—$SC_6$—TiOPc and NP—$SC_6$—ZnPc was carried out according to the procedure of Hu, Q., et al., *Molecular Design Strategy in Developing Titanyl Phthalocyanines as Dopant-Free Hole-Transporting Materials for Perovskite Solar Cells: Peripheral or Nonperipheral Substituents?* ACS applied materials & interfaces, 2019. 11(40): p. 36535-36543. The 3,6-bis(hexylthio)phthalonitrile, was prepared according to Scheme 1. NP—$SC_6$—TiOPc and NP—$SC_6$—ZnPc was prepared under templated cyclization conditions in the presence of DBU.

Synthesis of 3,6-bis(4'-methylphenylsulfonyloxy)phthalonitrile: As mixture of p-toluenesulfonyl chloride (5.1 g, 27 mmol), 2,3-dicyanohydroquinone (2.1 g, 13 mmol), potassium carbonate (6.9 g, 50 mmol) and acetone (15 mL) was heated to reflux for 3 h. The reaction mixture was poured into 70 mL DI H$_2$O and stirred for 30 min. A light brown solid was isolated by filtration and washed with H$_2$O (4×30 mL). A soluble gray impurity was removed by washing with acetone (2.0 mL) to afford 3,6-bis(4'-methylphenylsulfonyloxy)phthalonitrile as a colorless solid (5.3 g, 87%): 1H NMR (500 MHz, CDCl$_3$) δ 7.85-7.82 (m, 4H), 7.81 (s, 2H), 7.43-7.40 (m, 4H), 2.50 (s, 6H).

Synthesis of 3,6-bis(hexylthio)phthalonitrile: A mixture of hexane-1-thiol (3.5 g, 30 mmol), K$_2$CO$_3$ (5.5 g, 40 mmol) and DMSO (100 mL) was stirred at RT for 30 min. To the mixture, 3,6-bis(4'-methylphenylsulfonyloxy)phthalonitrile (4.7 g, 10 mmol) was slowly added and the reaction mixture was maintained at RT for 12 h. The crude reaction mixture was diluted with H$_2$O (200 mL) and extracted into chloroform (2×100 mL) and dichloromethane (2×150 mL). The combined organic extracts were further washed with 5% Na$_2$CO$_3$ (2×100 mL) and H$_2$O (2×100 mL). After removal of solvent under reduced pressure, a yellow solid was collected. Purification of the yellow solid was conducted by recrystallization from EtOH (20 mL) twice to give 3,6-bis(hexylthio)phthalonitrile as a bright yellow solid (2.9 g, 81%): 1H NMR (500 MHz, CDCl$_3$) δ 7.49 (s, 2H), 3.03-3.00 (t, 4H), 1.71-1.65 (m, 4H), 1.48-1.42 (m, 4H), 1.31-1.29 (m, 8H), 0.91-0.88 (t, 6H).

Synthesis of 1,4,8,11,15,18,22,25-octakis(hexylthio) phthalocyaninato oxotitanium(IV) (NP—$SC_6$—TiOPc): To a refluxing mixture of 3,6-bis(hexylthio)phthalonitrile (0.36 g, 1.0 mmol) and DBU (0.21 g, 1.4 mmol) in 1-pentanol (2.8 mL), Ti(iOPr)$_4$ (0.077 g, 0.27 mmol) was added. The mixture was maintained at reflux (150° C.) for 12 h. The mixture was allowed to cool to room temperature and concentrated under reduced pressure. The residue was dissolved in CHCl$_3$ (3 mL) and subjected to flash chromatography (SiO$_2$, 3:97 MeOH/CHCl$_3$) to achieve 1,4,8,11,15,18,22,25 octakis(hexylthio)phthalocyaninato oxotitanium (IV) as a purple solid (64 mg, 17%): UV-Vis ($\lambda_{max}$, nm) 850 nm; Elemental analysis calcd. (%) for C$_{80}$H$_{112}$N$_8$OS$_8$Ti: C, 63.80; H, 7.50; N, 7.44. Found: C, 64.01; H, 7.48; N, 7.60.

Synthesis of 1,4,8,11,15,18,22,25-octakis(hexylthio) phthalocyaninato Znic(II) (NP—$SC_6$—ZnPc): To a refluxing mixture of 3,6-bis(hexylthio)phthalonitrile (0.36 g, 1.0 mmol) and DBU (0.21 g, 1.4 mmol) in 1-pentanol (2.8 mL), ZnCl$_2$ (0.033 g, 0.27 mmol) was added. The mixture was maintained at reflux (150° C.) for 12 h. The mixture was allowed to cool to room temperature and concentrated under reduced pressure. The residue was dissolved in CHCl$_3$ (3 mL) and subjected to flash chromatography (SiO$_2$, 3:97 MeOH/CHCl$_3$) to achieve 1,4,8,11,15,18,22,25 octakis(hexylthio)phthalocyaninato Znic (II) as a blue solid (62 mg, 16%): UV-Vis ($\lambda_{max}$, nm) 833 nm; Elemental analysis calcd. (%) for C$_{80}$H$_{112}$N$_8$S$_8$Zn: C, 63.79; H, 7.50; N, 7.44. Found: C, 64.22; H, 7.58; N, 7.32.

Structure Characterization: X-ray diffraction patterns of the films deposited on FTO substrates were recorded using a Smartlab 9 kW diffractometer with a Göbel mirror attachment. Irradiation of the parallel CuK$_{\alpha 1, 2}$ X-ray beams were fixed at a grazing incident angle (θ) of 2.000°. The detector was independently moved to collect diffraction data in the 2θ range (3-30°) with a step size of 0.02° (2θ) at a fixed speed of 1 s/step. The morphologies of the thin-film samples were determined by atomic force microscopy (AFM) using a Keysight Technologies (5500AFM/STM) scanning probe microscope in tapping mode. The steady-state photoluminescence spectra were measured with a FLS980 Spectrometer (Edinburgh Instruments). The excitation light wavelength was 475 nm and the samples were various perovskites. Time-resolved photoluminescence decay curves were acquired for the perovskite films on FTO glass and for the perovskite/FTO glass stack (excitation using a 405-nm-wavelength pulsed laser). The contact angle measurements of perovskites were performed using a Drop Shape Analyzer (DSA 25S, KRUSS). The morphology and elemental mapping of the prepared samples were analyzed with the Scanning Electron Microscope (SEM, Zeiss Merlin). The chemical states of the elements in samples were identified with the X-ray photoelectron spectroscopy (XPS, ESCALB 250Xi) with Mg K radiation.

Fabrication and measurement of PSCs: FTO glasses were washed with cleaning fluid, deionized water, ethanol, acetone, and isopropanol, sequentially. SnO$_2$ based electron transporting layer (ETL) was prepared as disclosed by Dong, Q., et al., *Improved SnO2 electron transport layers solution-deposited at near room temperature for rigid or flexible perovskite solar cells with high efficiencies*. Advanced Energy Materials, 2019. 9(26): p. 1900834. The as-deposited ETLs were then treated with UV-Ozone for 20 min. Finally, the ETL substrates were transferred to the glove box (H$_2$O content <0.01 ppm). The perovskite absorber layers (~500 nm) were deposited on the ETL by using a method disclosed by Hu, Q., et al., *P3HT/Phthalocyanine Nanocomposites as Efficient Hole-Transporting Materials for Perovskite Solar Cells*. Solar RRL, 2019. 3(1): p. 1800264. The MAPbI$_3$ perovskite precursor solution was prepared by dissolving MAI (1.0 M) and PbI$_2$ (1.0 M) in mixed solvent consisting of 632 μL DMF and 71 μL DMSO. Dozen microliters of the precursor solution was spin-coated on FTO/SnO$_2$ substrate at 4000 rpm for 20 s in glove box, then a 0.3 mL antisolvent of chlorobenzene or chlorobenzene containing NP—SC$_6$—TiOPc/NP—SC$_6$—ZnPc (at a concentration of 0.5 mg/mL) was quickly dropped when ten seconds passed. Finally, the substrate was heated at 65° C. for two minutes, then 100° C. for ten minutes. The thickness of the photosensitive layer was measured using an Ambios Technology (Santa Cruz, CA) XP-2 profilometer. The precursor solution of Spiro-OMeTAD layer was prepared by dissolving 72.3 mg spiro-MeOTAD, 28.8 μL 4-tert-butylpyridine, 17.5 μL lithium bis(trifluoromethylsulphonyl)imide acetonitrile solution (520 mg mL$^{-1}$) into 1 mL chlorobenzene. Then, the doped spiro-MeOTAD layer was deposited on top of the perovskite layer by spin coating at 3000 rpm for 30 s. Finally, a 100 nm Au electrode was thermally evaporated under high vacuum (<10$^{-4}$ Pa) on top of the device. The active area of the device was 0.11 cm$^2$, defined by the aperture area of the mask. The as fabricated perovskite samples or PSC devices were denoted as MAPbI$_3$, MAPbI$_3$/TiOPc and MAPbI$_3$/ZnPc for using antisolvents of chlorobenzene, NP—SC$_6$—TiOPc/chlorobenzene, and NP—SC$_6$—ZnPc/chlorobenzene solution, respectively. The photocurrent-voltage (J-V) characteristics of the devices were measured with a Keithley 2400 digital source meter at a scan speed of 100 mV s$^{-1}$. The simulated AM 1.5 G sunlight with an irradiance equivalent to 100 mW cm$^{-2}$ was generated by an Oriel Solar 3A solar simulator and the intensity was calibrated with an VLSI standard incorporated PN 91150V Si reference cell. Steady-state output of the photocurrent and PCE was measured with a Keithley 2400 digital source meter under a certain bias. Dark current was measured with a Keithley 2400 digital source meter without illumination. The external quantum efficiency (EQE) spectrum was measured using a solar cell QE/EQE measurement system (Zolix Solar Cell Scan 100) model SR830 DSP lock-in amplifier coupled with a WDG3 monochromator and a 500 W xenon lamp. Electrochemical impedance spectroscopy (EIS) testing was conducted on a CIMPS-4 system (Zahner, ZOYPE).

DFT Calculations: All calculations were implemented by the Vienna Ab Initio Simulation Package (VASP). The generalized gradient approximation parameterized by Perdew-Burke-Ernzerhof (PBE) functional was adopted and the electron-ion interaction was performed by projector-augmented wave. The cut-off energy was set to be 500 eV and the k-points mesh was set to be 2×2×1 to optimize structures. The convergence threshold for the force was set to be 0.02 eV/Å. The slab consisting of a three-layer MAPbI$_3$ (001) was built and the vacuum was set to be 15 Å. The Van der Waals corrections (D3) were introduced to describe the effect of Van der Waals interactions in all calculations.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter. All references cited herein are incorporated by reference in their entirety.

What is claimed is:

1. A method for increasing stability or efficiency of an electronic component comprising an organometal halide perovskite material, the method comprising contacting the organometal halide perovskite material with a non-peripheral substituted phthalocyanine in such a manner that increases the stability or the efficiency of the electronic component,
wherein the contacting comprises at least one of:
i. coating the non-peripheral substituted phthalocyanine onto a surface of the organometal halide perovskite, or
ii. adding the non-peripheral substituted phthalocyanine to the organometal halide perovskite during a fabrication process of the electronic component,
wherein the non-peripheral substituted phthalocyanine is of the formula:

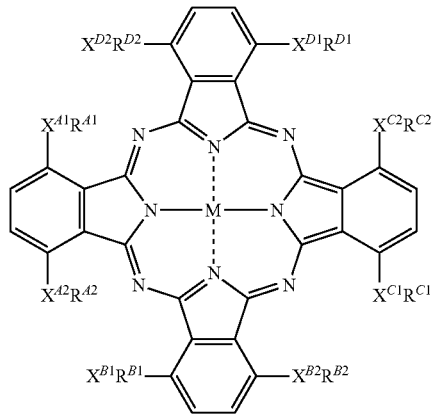

wherein
M is Ti=O, Zn, Cu, Fe, V=O, Al—Cl, Ga—Cl, In—Cl, Al—Br, Ga—Br, or In—Br;
each of $X^{A1}$, $X^{A2}$, $X^{B1}$, $X^{B2}$, $X^{C1}$, $X^{C2}$, $X^{D1}$, and $X^{D2}$ is independently S, O, or $NR^1$;
each of $R^{A1}$, $R^{A2}$, $R^{B1}$, $R^{B2}$, $R^{C1}$, $R^{C2}$, $R^{D1}$, and $R^{D2}$ is independently H or $C_4$-$C_{20}$ alkyl; and
each $R^1$ is independently H, $C_1$-$C_{20}$ alkyl, or a nitrogen protection group,
provided at least four of $R^{A1}$, $R^{A2}$, $R^{B1}$, $R^{B2}$, $R^{C1}$, $X^{C2}$, $R^{D1}$, and $R^{D2}$ are independently $C_4$-$C_{20}$ alkyl.

2. The method of claim 1, wherein at least six of $R^{A1}$, $R^{A2}$, $R^{B1}$, $R^{B2}$, $R^{C1}$, $R^{C2}$, $R^{D1}$, and $R^{D2}$ are independently $C_4$-$C_{20}$ alkyl.

3. The method of claim 2, wherein each of $R^{A1}$, $R^{A2}$, $R^{B1}$, $R^{B2}$, $R^{C1}$, $R^{C2}$, $R^{D1}$, and $R^{D2}$ is independently $C_4$-$C_{20}$ alkyl.

4. The method of claim 1, wherein each of $X^{A1}$, $Y^{A2}$, $X^{B1}$, $X^{B2}$, $X^{C1}$, $X^{C2}$, $X^{D1}$, and $X^{D2}$ is independently S or O.

5. The method of claim 1, wherein the electronic component comprises a photovoltaic device or a light-emitting diode.

6. The method of claim 1, wherein the organometal halide perovskite material is of the formula:

$ABX_mY_{3-m}$, wherein
A comprises $CH_3NH_3$, $C_4H_9NH_3$, $NH_2$=$CHNH_2$, $NH_2$=$C(NH_2)_2$, or a combination thereof;
B is Pb, Sn, or Bi;
each of X and Y is independently a halide selected from the group consisting of Cl, Br and I; and
m is an integer from 1 to 3.

7. The method of claim 1, wherein the organometal halide perovskite is of the formula:

$Cs_a(MA_bFA_{1-b})_{1-a}Pb(I_kCl_jBr_{1-k-j})_3$, wherein
MA is $CH_3NH_3$;
FA is $NH_2$=$CHNH_2$;
a=0.01 to 0.06;
b=0.1 to 0.2;
j=0.8 to 0.9; and
k=0.8 to 0.9.

8. The method of claim 1, wherein the presence of the non-peripheral substituted phthalocyanine increases a water droplet angle measurement by at least about 14% relative to the same organometal halide perovskite material in the absence of said non-peripheral substituted phthalocyanine.

9. The method of claim 1, wherein the presence of the non-peripheral substituted phthalocyanine increases a thermal stability by at least about 50% relative to the same organometal halide perovskite material in the absence of said non-peripheral substituted phthalocyanine.

10. The method of claim 1, wherein the presence of the non-peripheral substituted phthalocyanine reduces a root mean square roughness of said organometal halide perovskite material by at least 40% relative to the same organometal halide perovskite material in the absence of said non-peripheral substituted phthalocyanine.

11. The method of claim 10, wherein a root mean square roughness of said organometal halide perovskite material in the presence of the non-peripheral substituted phthalocyanine is less than 10 nm.

12. The method of claim 1, wherein the contacting comprises adding an anti-solvent containing the non-peripheral substituted phthalocyanine onto a perovskite wet layer containing the organometal halide perovskite.

* * * * *